United States Patent [19]

Horne, Jr. et al.

[11] 4,283,375

[45] Aug. 11, 1981

[54] PRODUCTION OF SiC WHISKERS

[75] Inventors: Ottis J. Horne, Jr.; David E. Ramsey, Jr., both of Johnson City, Tenn.

[73] Assignee: Great Lakes Carbon Corporation, New York, N.Y.

[21] Appl. No.: 115,684

[22] Filed: Jan. 28, 1980

[51] Int. Cl.³ .............................................. C01B 31/36
[52] U.S. Cl. ................................................... 423/345
[58] Field of Search ........................... 423/345; 106/44

[56] References Cited

U.S. PATENT DOCUMENTS

| 3,271,109 | 9/1966 | Mezey et al. | 423/345 |
| 3,335,049 | 8/1967 | Pultz | 423/345 X |
| 3,754,076 | 8/1973 | Cutler | 423/345 |

FOREIGN PATENT DOCUMENTS 661  2/1979  European Pat. Off. ................. 423/345

*Primary Examiner*—Jack Cooper
*Attorney, Agent, or Firm*—Adrian J. Good

[57] ABSTRACT

Silicon carbide whiskers useful for reinforcement of metals are manufactured from $SiO_2$ and carbon. Rice hulls are ashed in air at approximately 620° C. to obtain amorphous $SiO_2$, which is then blended with fine particle size carbon. The mixture is rapidly heated under CO atmosphere to 1500° C., and when the temperature reaches that point the CO atmosphere is flushed with argon, the SiC whiskers forming in the argon atmosphere. The product is purified by ashing in air to remove excess carbon and/or washed with HF to remove unreacted $SiO_2$.

11 Claims, No Drawings

PRODUCTION OF SiC WHISKERS

BACKGROUND OF THE INVENTION

Silicon carbide in the form of whiskers with a high aspect ratio of length to diameter has been proposed for use as a reinforcement in aluminum metal to increase its modulus of elasticity and greatly enhance its utility for the most critical aerospace applications. It has been reported that an addition of 25 volume % of SiC powder, of which about 20% was in the form of whiskers, increased the Young's modulus of the standard aircraft alloy 2024-T4 by approximately 100%, and the ultimate tensile strength by approximately 50%.

Silicon carbide occurs in two crystal forms, a $\beta$ form which is cubic, and an $\alpha$ form which crystalizes in both hexagonal and rhombohedral classes in a number of polytypes. Although there are broad temperature ranges in which either may form, temperatures higher than 1900° C. favor the formation of the $\alpha$ form and temperatures between 1200° to 1900° C. favor the formation of the $\alpha$ form. The $\alpha$ type is preferred as an abrasive due to its hardness, while the $\beta$ form has been of little commercial importance.

SiC whiskers have been made by the method disclosed by Cutler in U.S. Pat. No. 3,754,076, (1973); by Adamsky & Merz, Z. Krist 111, 350-361 (1959); and by Hamilton, J. Appl. Phys 31, 112-116 (1960); see Kirk-Othmer Enc. Chem. Tech. Vol. 4, 2nd Ed. Wiley & Sons, N.Y., 1964, (117-118). Kirchner, U.S. Pat. No. 2,018,133 (1935) disclosed the use of buckwheat hulls as an additive to the furnace charge. Japanese 52/113,300 by Tokai Carbon K. K., Cl C 01b-31/36, Oct. 3, 1978, discloses heating rice chaff in a vessel by high-frequency radiation in a tube-type furnace under CO atmosphere at 1700°-2000° C. U.S. Pat. No. 3,335,049, by Pultz, Aug. 8, 1967, Cl. 161-176 discloses the manufacture of SiC whiskers in a CO atmosphere at a partial pressure of from 5 to 500 mm. of mercury. U.S. Pat. No. 3,519,472, Dyne, July 7, 1970, discloses the manufacture of SiC by reacting SiO and CO between 1200° C. and 1600° C. in the presence of $H_2$ and C.

Considerable scientific study of SiC whiskers has been done and their properties have been found to be of great utility in reinforcing low modulus solids, but commercial development has been limited due to the extremely high cost of production. They are normally produced in gas-phase reactions with low yields in expensive processes, producing a limited supply at high prices.

One of the problems unsolved until the present invention was that of obtaining a reasonable yield of SiC whiskers. When attempting to manufacture whiskers, only about 20-25% of the SiC obtained is in the whisker form, the rest being a powder consisting of irregularly shaped particles of little or no value as reinforcement. It is difficult to separate the whiskers from the powder due to their small size. Mechanical screening is slow and imperfect, while air classification has so far been unsuccessful. Consequently, it is imperative to produce the whiskers in high yield if the material is ever to become a significant commercial product.

SUMMARY OF THE INVENTION $\beta$-Silicon carbide whiskers are produced in good yield from rice hulls. The hulls are ashed in air to obtain a yield of approximately 20% of amorphous silica on the raw material, which is in a favorable form for the production of SiC whiskers. Carbon is mixed with the silica and the mixture is fired from one to four hours at carbide-forming temperatures between 1200° and 1600° C. in an inert gas atmosphere to form the whiskers. All operations are at 1 atm. pressure.

The overall reaction is represented as
$SiO_2 + 3C \rightleftharpoons SiC + 2CO$.
The initial reaction is the reduction of silica to silicon by a reaction starting at approximately 1000° C.:
$SiO_2 + 2C \rightarrow Si + 2CO$.

As the temperature increases to 1400°-1500° C., this reaction becomes very rapid. With excess carbon present the reaction proceeds another step to form the carbide:

$$Si + C \xrightarrow{1400°-2000° C.} SiC.$$

The above reactions of reduction and carbide formation must be carried out in an inert atmosphere. If oxygen is present the carbon will merely oxidize to $CO_2$, and if nitrogen is present, silicon nitride will form preferentially over SiC by the reaction:

$$3Si + 2N_2 \xrightarrow{1300°} Si_3N_4.$$

We have found that argon is preferable, although other inert and noble gases may be used.

It was found that whisker formation occurred in much greater yield when the reaction was carried out rapidly, and to that end, one preferred method is to mix the silica and carbon and load the mixture into a preheated furnace with an argon atmosphere at 1500° C., taking approximately 15 minutes to reach that temperature.

The addition of a small amount of $Fe_2O_3$ also increases the speed of reaction, with quantities up to 14% to 28 wt.% of the $SiO_2$ promoting the formation of longer and greater diameter whiskers.

A variation of the process which has also increased the whisker yield is the use of a CO atmosphere during the upheat stage. This shifts the equilibrium in the reaction:
$SiO_2 + 3C \rightleftharpoons SiC + 2CO$
to the left as shown, suppressing the formation of silicon carbide in that stage. When the desired reaction temperature in the range of 1200°-1600° C. is reached, preferably 1500° C., the CO atmosphere is displaced by argon and the reaction proceeds rapidly with the formation of $\beta$-SiC whiskers of high aspect ratio (10 to 50$\mu$ length and 0.5 to 1.5$\mu$ diam.) in high yield.

It is preferable to ash the rice hulls at temperatures between 400° and 700° C., as 400° is the lower practical limit and above 700° the crystalline ash form predominates. Crystalline $SiO_2$, or $SiO_2$ with a high degree of crystallinity, is less suitable as a reactant to form the SiC whiskers because it yields lower reaction velocities.

After the carbide-forming step, the material may be ashed in air to remove excess carbon, treated with HF if excess $SiO_2$ remains, or treated with HCl to remove any remaining $Fe_2O_3$.

DESCRIPTION OF THE INVENTION

EXAMPLE 1

A charge of rice hulls was carbonized at 550° C., the preferred temperature in the range of 400° to 700° C. for 1 hr. in nitrogen, then milled to form an ultra fine carbonaceous powder. A second charge was ashed in air at 620° C. for 1 hr. to obtain fine amorphous $SiO_2$. Samples were prepared by mixing the two materials at various percentages of the silica. After mixing, each sample was fired in an inert atmosphere, the temperature rising at 700° per hour from ambient to 1850° C. in an inert atmosphere, and held four hrs. at that temperature. After removal from the furnace the samples were ashed in air to remove excess carbon. Yields obtained based on the original raw material were:

| $SiO_2$ addition, % to 100 parts carbonized rice hulls | SiC Yield % of raw materials |
|---|---|
| 0 | 11.2 |
| 5 | 12.4 |
| 10 | 13.6 |
| 15 | 15.1 |
| 20 | 15.8 |
| 25 | 16.0 |
| 30 | 16.4 |

Based on these results, a 30% $SiO_2$ addition was found preferable under these reaction conditions. Rice hulls, which normally have about 21% $SiO_2$, theoretically could yield 14% SiC based on the $SiO_2$ and C content, of the hulls.

EXAMPLE 2

In efforts to increase the whisker yield to a higher fraction of the SiC formed, the carbide-forming reaction was carried out in an argon atmosphere, after exchange with a CO atmosphere.

A charge of carbonized rice hulls in a crucible was loaded into a furnace preheated at 1500° C. under CO cover gas. When the sample reached 1500° C. (after approximately 15 minutes), the CO cover gas flow was stopped and argon used for the four hour duration of the run at 1500° C. The quality and quantity of the whiskers formed by this method were much better than when the same process was carried out without CO.

EXAMPLE 3

Carbonized rice hulls and $SiO_2$ from ashed rice hulls in a 55% $SiO_2$–45% C weight ratio, were mixed, placed in a furnace preheated at 1500° C. under CO, and when the sample temperature reached 1500° C. in about 15 minutes, the atmosphere was exchanged for one of argon, as in Example 2 above, and maintained at 1500° C. for four hours. A much better yield of whiskers was obtained than when using the carbonized rice hulls alone.

EXAMPLE 4

A charge of rice hull ash and carbonized rice hulls was processed as in Example 3 above in the presence of 28 p.p.h. $Fe_2O_3$ as a catalyst. This run resulted in slightly more and larger whiskers than the blend without $Fe_2O_3$. From one to 30 parts per hundred $Fe_2O_3$ based on $SiO_2$ appears useful.

EXAMPLE 5

The examples 2, 3, and 4 above were all carried out by loading the samples into a hot furnace at 1500° C. The best yield of whiskers was obtained by heating a $SiO_2$-carbon flour (100 mesh ground calcined petroleum coke) blend (55–45 parts by wt.) under CO cover gas, raising the temperature from ambient to 1500° C. in about 15 minutes at 100° C./min.–200° C./min. increase, then flushing the system with argon. Large quantities of whiskers were formed.

EXAMPLE 6

55 g. ashed rice hulls and 45 g. of calcined delayed petroleum coke flour (50% of which passing through a 200 mesh per in. screen), were heated from ambient to 1525° C. in about 15 minutes under 2 SCFH CO flow. On reaching 1525° C. the sample was flushed with argon at 4 SCFH and maintained at that temperature and in that gas flow for one hour. SiC whiskers were present in low yield.

EXAMPLE 7

1200 g. of the same blend used in Example 6 above was treated in the same manner in a 6 in. diam. furnace under 5 SCFH CO with the flow rate of argon increased to 20 SCFH and the hold time lengthened to 2 hours. A great improvement in SiC whisker quantity was noted.

EXAMPLE 8

A mixture of 55% ashed rice hulls and 45% graphite flour, (100% of which passing a 200 mesh per in. screen), was mixed and placed in a 6 in. diam. furnace preheated to 1500° C. and flushed with a 4.0 SCFH flow of CO. On reaching 1500° C. in about 15 minutes the CO atmosphere was purged with a 20.0 SCFH flow of argon and maintained at that temperature and flow of argon for one hour. Product yield before ashing was 74.4% and after ashing 44.8%, with some whiskers present in low yield. Graphite flour does not appear to be a highly promising source of C for the reaction.

We claim:
1. A process for the manufacture of β-silicon carbide whiskers of about 0.5 to 1.5μ in diameter and 10 to 50μ length comprising the steps of:
   (1) Ashing rice hulls in air at 400° to 700° C. to obtain amorphous $SiO_2$;
   (2) Mixing finely powdered carbonaceous powder selected from the group consisting of the carbonized residue from heating rice hulls in nitrogen at temperatures between 400° and 700° C. and calcined petroleum coke with the $SiO_2$ obtained in Step 1; (3) Heating the above mixture in CO at 1 atmosphere pressure;
   (4) When the above mixture reaches a carbide-forming temperature within the range of 1400° to 1600° C., flushing the container rapidly with an inert gas; and
   (5) Maintaining a flow of inert gas for a time sufficient to form SiC whiskers.
2. The process of claim 1 wherein the inert gas of step 5 is Ar, or other noble gas.
3. The process of claim 1 wherein from 10 to 55 parts $SiO_2$ and 90 to 45 parts carbonaceous powder by weight are mixed in Step 2.
4. The process of claim 1 wherein from 1 to 30 parts by wt. of $Fe_2O_3$ are added to 100 parts of $SiO_2$ before mixing during step 2.
5. The process of claim 1 wherein the temperature rise in step 4 is from 100° to 200° C./min.
6. The process of claim 1 wherein the mixture is placed in a preheated chamber at the carbide-forming temperature.

7. The process of claim 1 wherein the rice hulls are ashed in step 1 at approximately 620° C. for approximately one hour.

8. The process of claim 1 wherein the rice hulls are carbonized in nitrogen at approximately 550° C. for approximately one hour.

9. The process of claim 1 wherein the mixture is held at the carbide-forming temperature from one to four hours.

10. The process of claim 1 wherein the mixture is held at the carbide-forming temperature, of 1500° C. for approximately two hours.

11. A process for the production of $\beta$-SiC whiskers of 0.5 to 1.5$\mu$ diameter and 10 to 50$\mu$ in length comprising the steps of:

(1) Ashing a portion of rice hulls in air at about 620° C.;
(2) Mixing the ash thus obtained with a particulate source of carbon selected from the group consisting of rice hulls carbonized in nitrogen for one hour at about 550° C., and 100 mesh ground calcined petroleum coke, in a ratio of approximately 55% ash to 45% carbon source by wt.;
(3) Placing the mixture thus formed in a furnace;
(4) Replacing the furnace atmosphere with CO;
(5) Heating said mixture to about 1500° C. at a rate of temperature increase of at least 100° C. per minute;
(6) Replacing the CO atmosphere with argon when the temperature of said mixture reaches 1500° C.;
(7) Maintaining said mixture at 1500° C. in said argon atmosphere for about one hour.

* * * * *